(12) United States Patent
Oskooi et al.

(10) Patent No.: US 9,761,842 B2
(45) Date of Patent: Sep. 12, 2017

(54) ENHANCING LIGHT EXTRACTION OF ORGANIC LIGHT EMITTING DIODES VIA NANOSCALE TEXTURING OF ELECTRODE SURFACES

(71) Applicant: The Regents of the University of Michigan, Ann Arbor, MI (US)

(72) Inventors: Ardavan Oskooi, Ewing, NJ (US); Stephen R. Forrest, Ewing, NJ (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 14/976,786

(22) Filed: Dec. 21, 2015

(65) Prior Publication Data

US 2016/0197306 A1  Jul. 7, 2016

Related U.S. Application Data

(60) Provisional application No. 62/094,086, filed on Dec. 19, 2014.

(51) Int. Cl.
*H01L 51/52* (2006.01)
*H01L 21/768* (2006.01)

(52) U.S. Cl.
CPC .... *H01L 51/5268* (2013.01); *H01L 21/76817* (2013.01); *H01L 51/5225* (2013.01); *H01L 2251/5307* (2013.01); *H01L 2251/55* (2013.01)

(58) Field of Classification Search
CPC ............. H01L 51/5225; H01L 51/5268; H01L 2251/5307; H01L 2251/55
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |

(Continued)

FOREIGN PATENT DOCUMENTS

| | | |
|---|---|---|
| EP | 1238981 | 9/2002 |
| JP | 2010/135467 | 6/2010 |

(Continued)

OTHER PUBLICATIONS

K. Saxena, V. K. Jain, and D. S. Mehta, "A review on the light extraction techniques in organic electroluminescent devices," *Opt. Materials*, vol. 32, No. 1, pp. 221-233, 2009.

(Continued)

*Primary Examiner* — Allan R Wilson
(74) *Attorney, Agent, or Firm* — Riverside Law LLP

(57) ABSTRACT

An organic light emitting device is described, having an OLED including an anode, a cathode, and at least one organic layer between the anode and cathode. At least a portion of an electrode surface includes a plurality of scattering structures positioned in a partially disordered pattern resembling nodes of a two dimensional lattice. The scattering structures are positioned around the nodes of the two dimensional lattice with the average distance between the position of each scattering structure and a respective node of the lattice is from 0 to 0.5 of the distance between adjacent lattice nodes. A method of manufacturing an organic light emitting device and a method of enhancing the light-extraction efficiency of an organic light emitting device are also described.

10 Claims, 8 Drawing Sheets

(56) References Cited

U.S. PATENT DOCUMENTS

| | | | |
|---|---|---|---|
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 7,279,704 | B2 | 10/2007 | Walters et al. |
| 7,431,968 | B1 | 10/2008 | Shtein et al. |
| 7,968,146 | B2 | 6/2011 | Wagner et al. |
| 9,246,122 | B2* | 1/2016 | Shinotsuka ......... H01L 51/5225 |
| 2003/0230980 | A1 | 12/2003 | Forrest et al. |
| 2004/0174116 | A1 | 9/2004 | Lu et al. |
| 2008/0272689 | A1* | 11/2008 | Ide ..................... H01L 51/5206 313/504 |
| 2013/0026452 | A1 | 1/2013 | Kottas et al. |
| 2013/0119354 | A1 | 5/2013 | Ma et al. |
| 2014/0001450 | A1* | 1/2014 | Shinotsuka ......... H01L 51/5225 257/40 |
| 2015/0041771 | A1* | 2/2015 | Cho ....................... H01L 51/56 257/40 |
| 2016/0124128 | A1* | 5/2016 | Guo ..................... G02B 5/0215 359/599 |
| 2016/0284774 | A1* | 9/2016 | Zhang .................... H01L 21/77 |

FOREIGN PATENT DOCUMENTS

| | | |
|---|---|---|
| WO | 2004/111066 | 12/2004 |
| WO | 2008/044723 | 4/2008 |
| WO | 2008057394 | 5/2008 |
| WO | 2010011390 | 1/2010 |
| WO | 2010/111175 | 9/2010 |

OTHER PUBLICATIONS

W. Brutting, J. Frischeisen, T. D. Schmidt, B. J. Scholz, and C. Mayr, "Device efficiency of organic light-emitting diodes: Progress by improved light outcoupling," *Phys. Status Solidi A*, vol. 210, No. 1, pp. 44-65, 2013.

V. Bulovic, V. B. Khalfin, G. Gu, P. E. Burrows, D. Z. Garbuzov, and S. R. Forrest, "Weak microcavity effects in organic light-emitting devices," *Phys. Rev. B*, vol. 58, No. 7, pp. 3730-3740, 1998.

S. Nowy, B. C. Krummacher, J. Frischeisen, N. A. Reinke, and W. Brutting, "Light extraction and optical loss mechanisms in organic light-emitting diodes: Influence of the emitter quantum efficiency," *J. Appl. Phys.*, vol. 104, No. 123109, 2008.

K. Y. Yang, K. C. Choi, and C. W. Ahn, "Surface plasmon-enhanced spontaneous emission rate in an organic lightemitting device structure: Cathode structure for plasmonic application," *Appl. Phys. Lett.*, vol. 94, No. 173301, 2009.

M. Furno, R. Meerheim, S. Hofmann, B. Lussem, and K. Leo, "Efficiency and rate of spontaneous emission in organic electroluminescent devices," *Phys. Rev. B*, vol. 85, No. 115205, 2012.

A. F. Oskooi, D. Roundy, M. Ibanescu, P. Bermel, J. D. Joannopoulos, and S. G. Johnson,"MEEP: A flexible free-software package for electromagnetic simulations by the FDTD method," *Computer Physics Communications*, vol. 181, pp. 687-702, 2010.

A. Taflove, A. Oskooi, and S. G. Johnson, eds., *Advances in FDTD Computational Electrodynamics: Photonics and Nanotechnology*. ch. 4: Electromagnetic Wave Source Conditions. Boston: Artech, 2013.[1]

W. L. Barnes, "Fluorescence near interfaces: the role of photonic mode density," *J. Mod. Opt.*, vol. 45, No. 4, pp. 661-699, 1998.

J. M. Lupton, B. J. Matterson, I. D. W. Samuel, M. J. Jory, and W. L. Barnes, "Bragg scattering from periodically microstructured light emitting diodes," *Appl. Phys. Lett.*, vol. 77, No. 21, pp. 3340-3342, 2000.

P. A. Hobson, S.Wedge, J. A. E.Wasey, I. Sage, and W. L. Barnes, "Surface plasmon mediated emission from organic light-emitting diodes," *Adv. Materials*, vol. 14, No. 19, pp. 1393-1396, 2002.

U. Geyer, J. Hauss, B. Riedel, S. Gleiss, U. Lemmer, and M. Gerken, "Large-scale patterning of indium tin oxide electrodes for guided mode extraction from organic light-emitting diodes,"*J. Appl. Phys.*, vol. 104, No. 093111, 1998.

J. Frischeisen, Q. Niu, A. Abdellah, J. B. Kinzel, R. Gehlhaar, G. Scarpa, C. Adachi, P. Lugli, and W. Brutting, "Light extraction from surface plasmons and waveguide modes in an organic light-emitting layer by nanoimprinted gratings," *Opt. Express*, vol. 19, pp. A7-A19, 2010.

C. S. Choi, D.-Y. Kim, S.-M. Lee, M. S. Lim, K. C. Choi, H. Cho, T.-W. Koh, and S. Yoo,"Blur-free outcoupling enhancement in transparent organic light emitting diodes: a nanostructure extracting surface plasmon modes," *Adv. Opt. Materials*, vol. 1, No. 10, pp. 687-691, 2013.

Y. Sun, N. C. Giebink, H. Kanno, B. Ma, M. E. Thompson, and S. R. Forrest, "Management of singlet and triplet excitons for efficient white organic light-emitting devices," *Nature*, vol. 440, No. 7086, pp. 908-912, 2006.

A. Oskooi, P. Favuzzi, Y. Tanaka, H. Shigeta, Y. Kawakami, and S. Noda, "Partially disordered photonic-crystal thin films for enhanced and robust photovoltaics," *Appl. Phys. Lett.*, vol. 100, No. 181110, 2012.

A. Oskooi, Y. Tanaka, and S. Noda, "Tandem photonic-crystal thin-films surpassing Lambertian light-trapping limit over broad bandwidth and angular range," *Appl. Phys. Lett.*, vol. 104, No. 010121, 2014.

A. Oskooi, M. De Zoysa, K. Ishizaki, and S. Noda, "Experimental demonstration of quasiresonant absorption in silicon thin films for enhanced solar light trapping," *ACS Photonics*, vol. 1, pp. 304-309, 2014.

A. D. Rakic, A. B. Djurisic, J. M. Elazar, and M. L. Majewski, "Optical properties of metallic films for vertical-cavity optoelectronic devices," *Appl. Opt.*, vol. 37, No. 22, pp. 5271-5283, 1998.

A. Oskooi and S. G. Johnson, "Advances in Computational Electrodynamics: Photonics and Nanotechnology", ch. 4: Electromagnetic Wave Source Conditions. Boston: Artech, 2013.

P. W. Milonni, "Semiclassical and quantum-electrodynamical approaches in nonrelativistic radiation theory," *Physics Reports*, vol. 25, pp. 1-81, 1976.

F. Wijnands, J. B. Pendry, F. J. Garcia-Vidal, P. M. Bell, P. J. Roberts, and L. M. Moreno,"Green's functions for Maxwell's equations: application to spontaneous emission," *Optical and Quantum Electron.*, vol. 29, pp. 199-216, 1997.

Y. Xu, R. K. Lee, and A. Yariv, "Quantum analysis and the classical analysis of spontaneous emission in a microcavity," *Phys. Rev. A*, vol. 61, No. 033807, 2000.

H. Raether, "Surface Plasmons on Smooth and Rough Surfaces and on Gratings". New York: Springer-Verlag, 1988[2].

R. M. Amos and W. L. Barnes, "Modification of spontaneous emission lifetimes in the presence of corrugated metallic surfaces," *Phys. Rev. B*, vol. 59, No. 7708, 1999.

E. Fort and S. Gressilon, "Surface enhanced fluorescence," *J. Phys. D: Appl. Phys.*, vol. 41, No. 013001, 2008.

J. Burke, G. Stegeman, and T. Tamir, "Surface-polariton-like waves guided by thin, lossy metal films," *Phys. Rev. B*, vol. 33, No. 8, pp. 5186-5201, 1986.

K. Okamoto, I. Niki, A. Shvartser, Y. Narukawa, T. Mukai, and A. Scherer, "Surface-plasmon-enhanced light emitters based on InGaN quantum wells," *Nat. Materials*, vol. 3, pp. 601-605, 2005.

W. H. Koo, S. M. Jeong, F. Araoka, K. Ishikawa, S. Nishimura, T. Toyooka, and H. Takezoe,"Light extraction from organic light-emitting diodes enhanced by spontaneously formed buckles," *Nat. Photonics*, vol. 4, pp. 222-226, 2010.

Baldo et al., "Highly Efficient Phosphorescent Emission from Organic Electroluminescent Devices," *Nature*, vol. 395, 151-154, (1998).

(56) References Cited

OTHER PUBLICATIONS

Baldo et al., "Very high-efficiency green organic light-emitting devices based on electrophosphorescence," Appl. Phys. Lett., vol. 75, No. 1, 4-6 (1999).

* cited by examiner

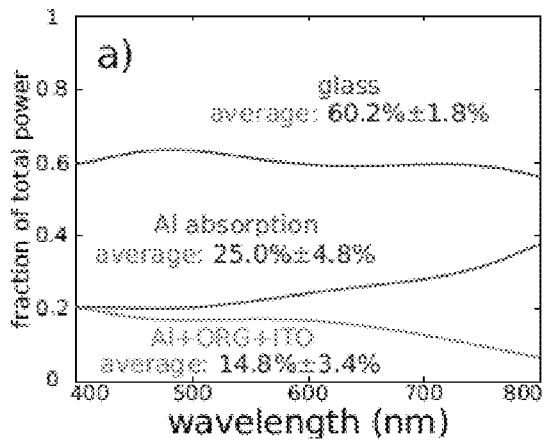
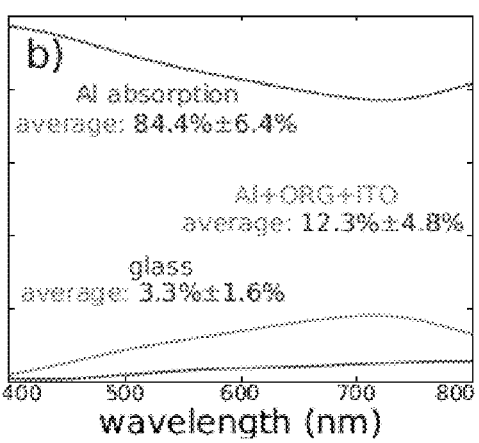
FIG. 5A  FIG. 5B
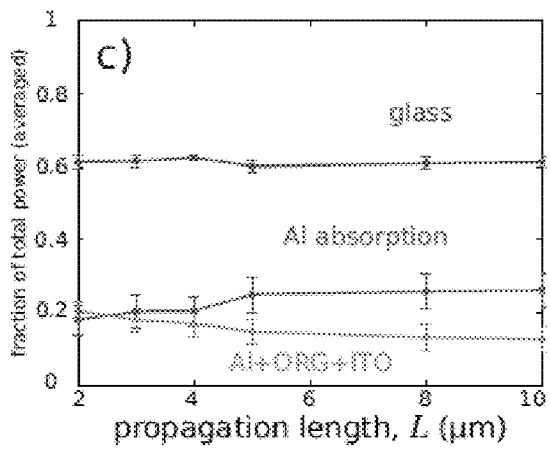
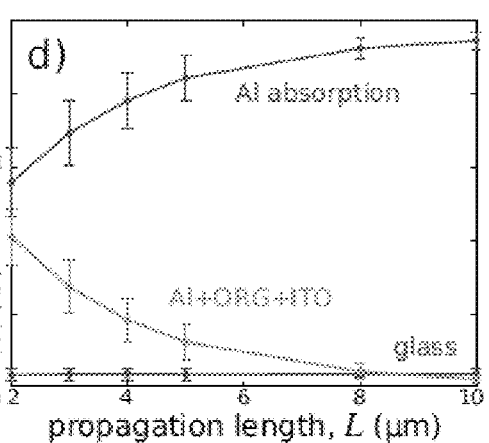
FIG. 5C  FIG. 5D

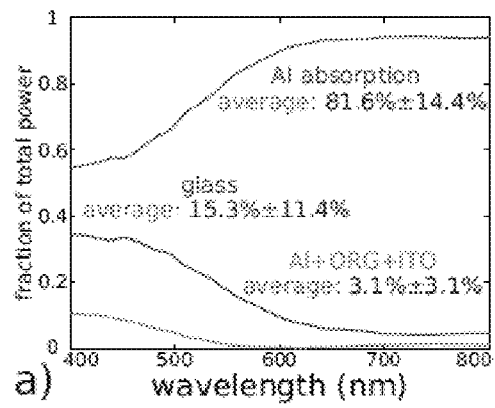
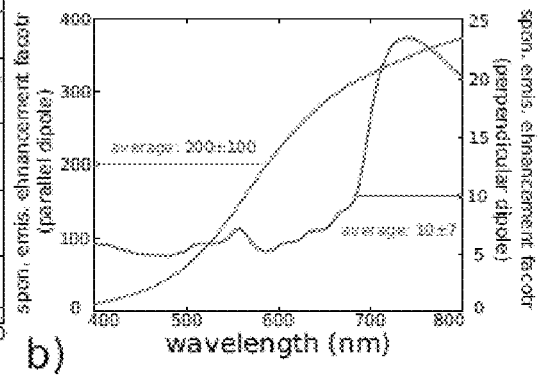
FIG. 6A
FIG. 6B
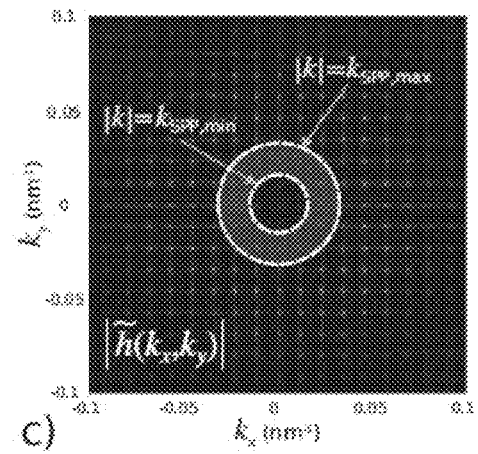
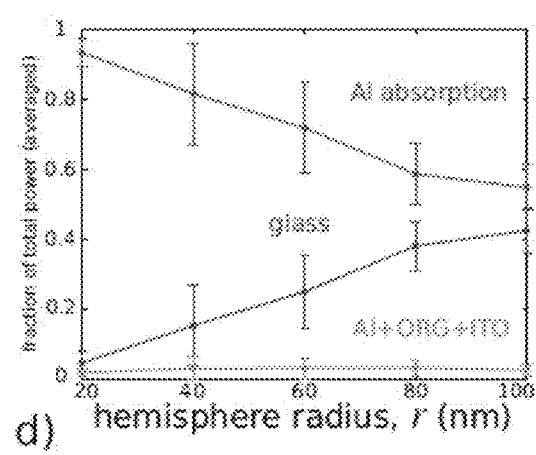
FIG. 6C
FIG. 6D

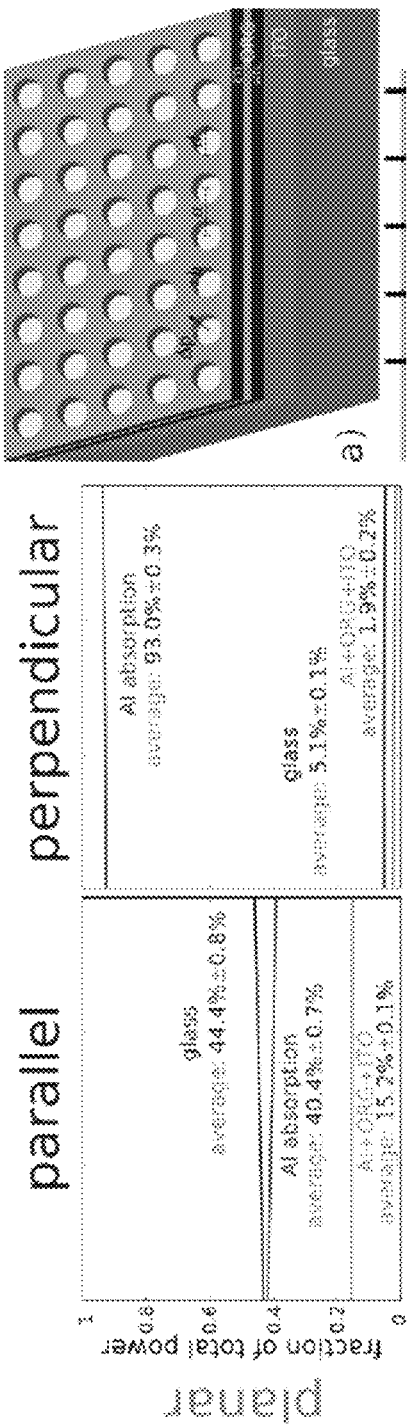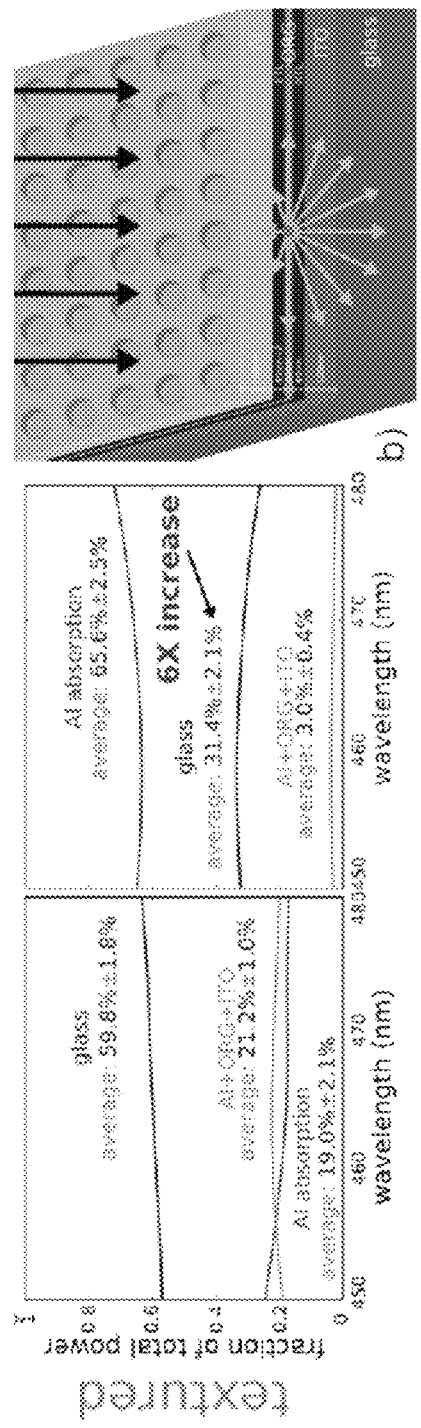
FIG. 8A
FIG. 8B

ENHANCING LIGHT EXTRACTION OF ORGANIC LIGHT EMITTING DIODES VIA NANOSCALE TEXTURING OF ELECTRODE SURFACES

CROSS-REFERENCE TO RELATED APPLICATIONS

This application is a non-provisional of U.S. Provisional Patent Application Ser. No. 62/094,086, filed Dec. 19, 2014, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to enhancing light extraction of organic light-emitting diodes via nanoscale texturing of electrode surfaces, and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

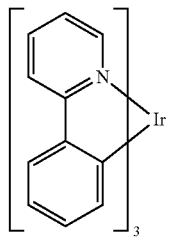

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Throughout the present disclosure, reference will be made to the following references, which are hereby incorporated by reference in their entireties:

[1] M. A. Baldo, D. F. O'brien, Y. You, A. Shoustikov, S. Sibley, M. E. Thompson, and S. R. Forrest, Highly efficient phosphorescent emission from organic electroluminescent devices," *Nature*, vol. 395, no. 6698, pp. 151-154, 1998.

[2] K. Saxena, V. K. Jain, and D. S. Mehta, "A review on the light extraction techniques in organic electroluminescent devices," *Opt. Materials*, vol. 32, no. 1, pp. 221-233, 2009.

[3] W. Brutting, J. Frischeisen, T. D. Schmidt, B. J. Scholz, and C. Mayr, "Device efficiency of organic light-emitting diodes: Progress by improved light outcoupling," *Phys. Status Solidi A*, vol. 210, no. 1, pp. 44-65, 2013.

[4] V. Bulovic, V. B. Khalfin, G. Gu, P. E. Burrows, D. Z. Garbuzov, and S. R. Forrest, "Weak microcavity effects in organic light-emitting devices," *Phys. Rev. B*, vol. 58, no. 7, pp. 3730-40, 1998.

[5] S. Nowy, B. C. Krummacher, J. Frischeisen, N. A. Reinke, and W. Brutting, "Light extraction and optical loss mechanisms in organic light-emitting diodes: Influence of the emitter quantum efficiency," *J. Appl. Phys.*, vol. 104, no. 123109, 2008.

[6] K. Y. Yang, K. C. Choi, and C. W. Ahn, "Surface plasmon-enhanced spontaneous emission rate in an organic lightemitting device structure: Cathode structure for plasmonic application," *Appl. Phys. Lett.*, vol. 94, no. 173301, 2009.

[7] M. Furno, R. Meerheim, S. Hofmann, B. Lussem, and K. Leo, "Efficiency and rate of spontaneous emission in organic electroluminescent devices," *Phys. Rev. B*, vol. 85, no. 115205, 2012.

[8] A. F. Oskooi, D. Roundy, M. Ibanescu, P. Bermel, J. D. Joannopoulos, and S. G. Johnson, "MEEP: A flexible free-software package for electromagnetic simulations by the FDTD method," *Computer Physics Communications*, vol. 181, pp. 687-702, 2010.

[9] A. Taflove, A. Oskooi, and S. G. Johnson, eds., *Advances in FDTD Computational Electrodynamics: Photonics and Nanotechnology*. Boston: Artech House, 2013.

[10] W. L. Barnes, "Fluorescence near interfaces: the role of photonic mode density," *J. Mod. Opt.*, vol. 45, no. 4, pp. 661-699, 1998.

[11] J. M. Lupton, B. J. Matterson, I. D. W. Samuel, M. J. Jory, and W. L. Barnes, "Bragg scattering from periodically microstructured light emitting diodes," *Appl. Phys. Lett.*, vol. 77, no. 21, pp. 3340-3342, 2000.

[12] P. A. Hobson, S. Wedge, J. A. E. Wasey, I. Sage, and W. L. Barnes, "Surface plasmon mediated emission from organic light-emitting diodes," *Adv. Materials*, vol. 14, no. 19, pp. 1393-1396, 2002.

[13] U. Geyer, J. Hauss, B. Riedel, S. Gleiss, U. Lemmer, and M. Gerken, "Large-scale patterning of indium tin oxide electrodes for guided mode extraction from organic light-emitting diodes," *J. Appl. Phys.*, vol. 104, no. 093111, 1998.

[14] J. Frischeisen, Q. Niu, A. Abdellah, J. B. Kinzel, R. Gehlhaar, G. Scarpa, C. Adachi, P. Lugli, and W. Brutting, "Light extraction from surface plasmons and waveguide modes in an organic light-emitting layer by nanoimprinted gratings," *Opt. Express*, vol. 19, pp. A7-A19, 2010.

[15] C. S. Choi, D.-Y. Kim, S.-M. Lee, M. S. Lim, K. C. Choi, H. Cho, T.-W. Koh, and S. Yoo, "Blur-free outcoupling enhancement in transparent organic light emitting diodes: a nanostructure extracting surface plasmon modes," *Adv. Opt. Materials*, vol. 1, no. 10, pp. 687-691, 2013.

[16] Y. Sun, N. C. Giebink, H. Kanno, B. Ma, M. E. Thompson, and S. R. Forrest, "Management of singlet and triplet excitons for efficient white organic light-emitting devices," *Nature*, vol. 440, no. 7086, pp. 908-912, 2006.

[17] A. Oskooi, P. Favuzzi, Y. Tanaka, H. Shigeta, Y. Kawakami, and S. Noda, "Partially disordered photonic-crystal thin films for enhanced and robust photovoltaics," *Appl. Phys. Lett.*, vol. 100, no. 181110, 2012.

[18] A. Oskooi, Y. Tanaka, and S. Noda, "Tandem photonic-crystal thin-films surpassing Lambertian light-trapping limit over broad bandwidth and angular range," *Appl. Phys. Lett.*, vol. 104, no. 010121, 2014.

[19] A. Oskooi, M. De Zoysa, K. Ishizaki, and S. Noda, "Experimental demonstration of quasiresonant absorption in silicon thin films for enhanced solar light trapping," *ACS Photonics*, vol. 1, pp. 304-309, 2014.

[20] A. D. Rakic, A. B. Djurisic, J. M. Elazar, and M. L. Majewski, "Optical properties of metallic films for vertical-cavity optoelectronic devices," *Appl. Opt.*, vol. 37, no. 22, pp. 5271-5283, 1998.

[21] A. Oskooi and S. G. Johnson, *Advances in Computational Electrodynamics: Photonics and Nanotechnology*, ch. 4: Electromagnetic Wave Source Conditions. Boston: Artech, 2013.

[22] P. W. Milonni, "Semiclassical and quantum-electrodynamical approaches in nonrelativistic radiation theory," *Physics Reports*, vol. 25, pp. 1-81, 1976.

[23] F. Wijnands, J. B. Pendry, F. J. Garcia-Vidal, P. M. Bell, P. J. Roberts, and L. M. Moreno, "Green's functions for Maxwell's equations: application to spontaneous emission," *Optical and Quantum Electron.*, vol. 29, pp. 199-216, 1997.

[24] Y. Xu, R. K. Lee, and A. Yariv, "Quantum analysis and the classical analysis of spontaneous emission in a microcavity," *Phys. Rev. A*, vol. 61, no. 033807, 2000.

[25] H. Raether, *Surface Plasmons on Smooth and Rough Surfaces and on Gratings*. New York: Springer-Verlag, 1988.

[26] R. M. Amos and W. L. Barnes, "Modification of spontaneous emission lifetimes in the presence of corrugated metallic surfaces," *Phys. Rev. B*, vol. 59, no. 7708, 1999.

[27] E. Fort and S. Gressilon, "Surface enhanced fluorescence," *J. Phys. D: Appl. Phys.*, vol. 41, no. 013001, 2008.

[28] J. Burke, G. Stegeman, and T. Tamir, "Surface-polariton-like waves guided by thin, lossy metal films," *Phys. Rev. B*, vol. 33, no. 8, pp. 5186-5201, 1986.

[29] K. Okamoto, I. Niki, A. Shvartser, Y. Narukawa, T. Mukai, and A. Scherer, "Surface-plasmonenhanced light emitters based on InGaN quantum wells," *Nat. Materials*, vol. 3, pp. 601-605, 2005.

[30] W. H. Koo, S. M. Jeong, F. Araoka, K. Ishikawa, S. Nishimura, T. Toyooka, and H. Takezoe, "Light extraction from organic light-emitting diodes enhanced by spontaneously formed buckles," *Nat. Photonics*, vol. 4, pp. 222-226, 2010.

The development of organic light-emitting diodes (OLEDs), particularly those based on small-molecule phosphorescent materials [1], has led to a number of commercial applications arising from their nearly 100% internal quantum efficiency (IQE). Yet the external quantum efficiency (EQE) which takes into account the light-extraction efficiency still has significant room for improvement despite intensive work based on a number of different designs including microlens arrays, low-index microstructured grids, high-index substrates, orienteddipole emitters, photonic crystals, and plasmonic out-coupling schemes [2, 3].

What is needed in the art is a design strategy for enhancing both the light-extraction efficiency and the spontaneous-emission rate of the excitons [4-7] in nanostructured, white-emitting OLEDs (WOLEDs) operating under the conditions of broad spectral bandwidth and isotropic emitters.

SUMMARY OF THE INVENTION

According to an embodiment, an organic light emitting device, includes an OLED including an anode, a cathode, and at least one organic layer between the anode and cathode; where at least a portion of the cathode surface includes multiple scattering structures positioned in a partially disordered pattern resembling nodes of a two dimensional lattice, where the scattering structures are positioned around the nodes of the two dimensional lattice with the average distance between the position of each scattering structure and a respective node of the lattice is from 0 to 0.5 of the distance between adjacent lattice nodes. In one embodiment, the scattering structures are on the cathode surface adjacent the at least one organic layer. In one embodiment, the distance between at least two of the scattering structures is from 150 nm to 650 nm. In one embodiment, at least one of the scattering structures is a protrusion. In one embodiment, the at least one scattering structure protrudes into the at least one organic layer. In one embodiment, at least one of the scattering structures is a recess into the cathode surface. In one embodiment, the scattering structures are hemispheres. In one embodiment, the device is a bottom-emitting OLED device. In one embodiment, the partially disordered pattern resembles nodes of a two dimensional square lattice. In one embodiment, the partially disordered pattern resembles nodes of a two dimensional periodic lattice.

In one embodiment, a method of manufacturing an organic light emitting device includes the steps of disposing an OLED on a substrate, the OLED comprising an anode, a cathode and at least one organic layer between the anode and cathode; and texturing at least a portion of the cathode surface with multiple scattering structures positioned in a partially disordered pattern resembling nodes of a two dimensional lattice, where the scattering structures are positioned around the nodes of the two dimensional lattice with the average distance between the position of each scattering structure and a respective node of the lattice is from 0 to 0.5 of the distance between adjacent lattice nodes. In one embodiment, the scattering structures are textured via soft stamp embossing. In one embodiment, the scattering structures are textured via hard stamp embossing. In one embodiment, the scattering structures are textured via soft contact removal. In one embodiment, at least one of the scattering structures is a protrusion. In one embodiment, the scattering structures are hemispheres. In one embodiment, the partially disordered pattern resembles nodes of a two dimensional square lattice. In one embodiment, the partially disordered pattern resembles nodes of a two dimensional periodic lattice.

In one embodiment, a method of enhancing the light-extraction efficiency of an organic light emitting device includes the steps of texturing at least a portion of an electrode surface of an OLED with multiple scattering structures positioned in a partially disordered pattern resembling nodes of a two dimensional lattice, where the scattering structures are positioned around the nodes of the two dimensional lattice with the average distance between the position of each scattering structure and a respective node of the lattice is from 0 to 0.5 of the distance between adjacent lattice nodes. In one embodiment, the scattering structures are textured via soft stamp embossing. In one embodiment, the scattering structures are textured via hard stamp embossing. In one embodiment, the scattering structures are textured via soft contact removal. In one embodiment, at least one of the scattering structures is a protrusion. In one embodiment, the scattering structures are hemispheres. In one embodiment, the partially disordered pattern resembles nodes of a two dimensional square lattice. In one embodiment, the partially disordered pattern resembles nodes of a two dimensional periodic lattice.

According to another embodiment, a first device comprising a first organic light emitting device is also provided. The first organic light emitting device can include an OLED including an anode, a cathode, and at least one organic layer between the anode and cathode; where at least a portion of the cathode surface includes multiple scattering structures positioned in a partially disordered pattern resembling nodes of a two dimensional lattice, where the scattering structures are positioned around the nodes of the two dimensional lattice with the average distance between the position of each scattering structure and a respective node of the lattice is from 0 to 0.5 of the distance between adjacent lattice nodes. The first device can be a consumer product, an organic light-emitting device, and/or a lighting panel.

BRIEF DESCRIPTION OF THE DRAWINGS

FIGS. 5A-5D show optical properties of a planar OLED. (a), (b) Fraction of total dipole power in each of the three components of the OLED with L=5 μm: glass, combined cathode/organic interface and organic/ITO waveguide (Al+ORG+ITO) and Al absorption for (a) parallel and (b) perpendicular dipoles relative to the substrate plane. (c), (d) Fraction of total dipole power, averaged over the wavelength spectrum, in the three device regions as functions of propagation length (L) under the cathode for dipoles with orientation (c) parallel and (d) perpendicular to the substrate plane. Losses in the metal due to the surface-plasmon polaritons are dominant.

FIG. 6A shows the fraction of total power of perpendicular dipoles in different device regions versus wavelength for a device with L=10 μm with an Al cathode consisting of a periodic lattice (a=550 nm) of hemispheres (r=40 nm) with no disorder. FIG. 6B shows spontaneous-emission-enhancement factor of the nanostructured OLED relative to an unpatterned device versus wavelength for the two orthogonal dipole orientations: parallel (left vertical axis) and perpendicular (right). The average enhancement over the wavelength spectrum is shown. FIG. 6C shows the Fourier transform of the height function of the surface texture, with the range of SPPs shown within the annular region. FIG. 6D shows the fraction of total power for perpendicular dipoles, averaged over the wavelength spectrum, in the three device regions as a function of hemisphere radius r with fixed a=550 nm and no disorder. Results for parallel dipoles show a trend opposite to that of the Al absorption, increasing with r.

FIGS. 8A and 8B show optical properties of a planar and textured OLED respectively. The planar OLED in the parallel dipole orientation saw a fraction of total power average of 44.4% for glass, 40.4% for Al absorption, and 15.2% for Al+ORG+ITO. The planar OLED in the perpendicular dipole orientation saw a fraction of total power average of 5.1% for glass, 93.0% for Al absorption, and 1.9% for Al+ORG+ITO. The textured OLED in the parallel dipole orientation saw a fraction of total power average of 59.8% for glass, 19.0% for Al absorption, and 21.2% for Al+ORG+ITO. The textured OLED in the perpendicular dipole orientation saw a fraction of total power average of 31.4% for glass, 65.6% for Al absorption, and 3.0% for Al+ORG+ITO. This represents a 6x increase in the average fraction of total power for glass over the planar OLED in the perpendicular dipole orientation.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
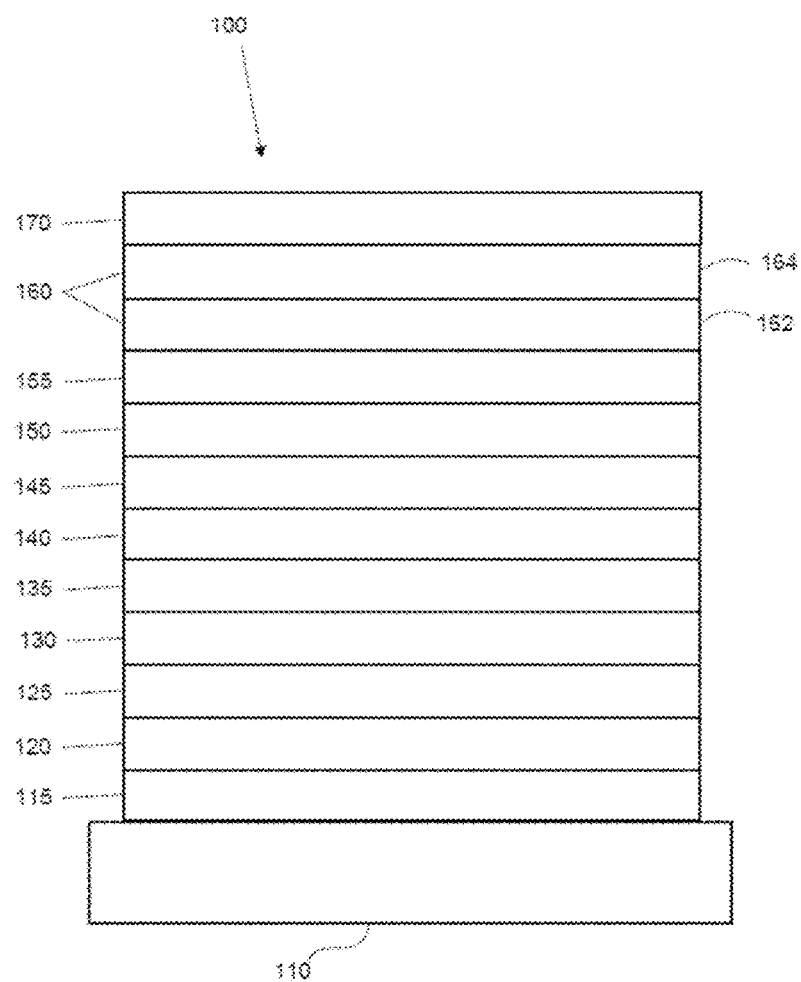
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
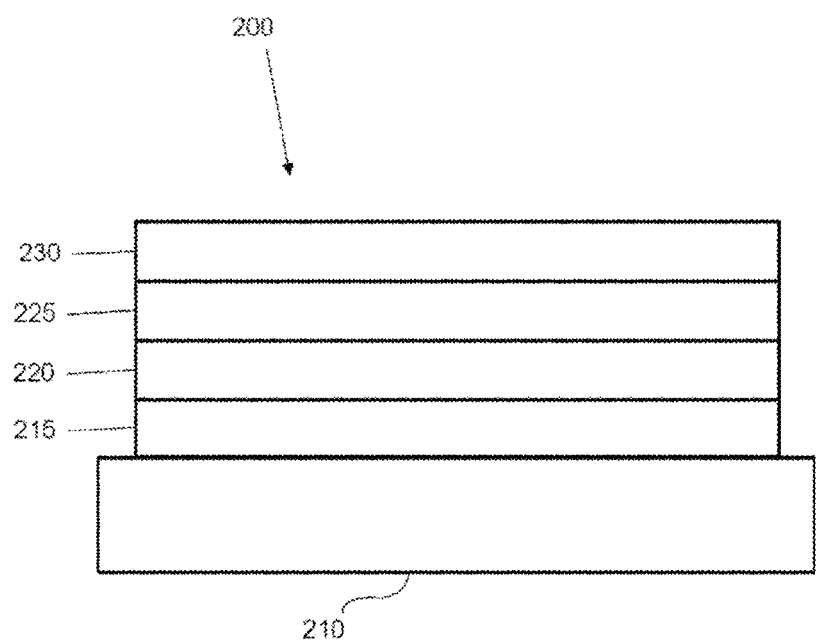
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Figure 4A:
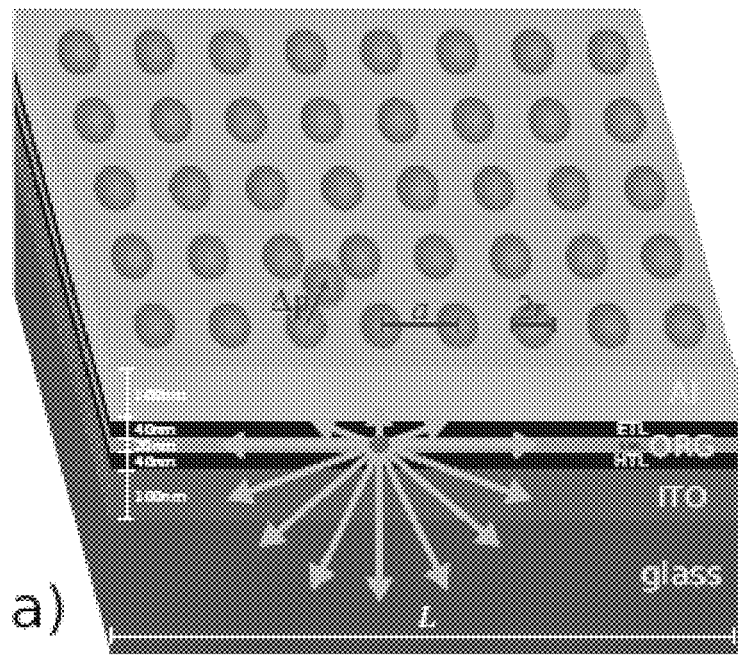
FIG. 4A shows a schematic of a bottom-emitting OLED with a square profile of length L comprised of an aluminum (Al) cathode, electron-transporting (ETL) and emissive (EML) and hole-transporting (HTL) organic (ORG) layers, and indium-tin oxide (ITO) transparent anode, on top of a glass substrate according to one embodiment. The thickness of each layer is marked. The surface of the ETL consists of a lattice with periodicity a of Al hemispheres with radius r protruding into the organic. Random disorder is introduced into the lattice by perturbing each hemisphere by an amount $\Delta p$ whose values range between 0 and $\overline{\Delta p}$. Incoherent electric point-dipole sources are positioned within the EML to simulate the dynamics of exciton recombination.

Embodiments for enhancing both the light-extraction efficiency and the spontaneous-emission rate of the excitons [4-7] in nanostructured, white-emitting OLEDs (WOLEDs) operating under the conditions of broad spectral bandwidth and isotropic emitters are now described. In one embodiment, a texture is applied consisting of a two-dimensionally-periodic lattice of nanoscale scatterers augmented with limited disorder at the metal-cathode surface. This design fulfills two objectives: (1) to enhance coupling to the surface-plasmon polaritons to boost the rate of exciton decay and (2) to radiatively scatter out as many of these otherwise non-radiative modes over the shortest possible distance. A three-dimensional electromagnetic solver [8, 9] is employed to simulate the optical properties of a WOLED by statistically modeling the dynamics of exciton recombination, and with this develop principles underlying the design of an effective scattering texture. While several previous works have focused on reducing losses from surface plasmons via texturing [10-15], a general design strategy is lacking for reducing such losses while simultaneously enhancing the light-extraction efficiency and the spontaneous emission rate of excitons compared to an unpatterned device. Embodiments disclosed herein are used to identify properties of a particularly advantageous texture, as shown in FIG. 4a. This design is found to be effective in extracting light over a broad bandwidth, and hence is potentially suitable for WOLEDs [16] used in solid-state lighting. Broad spectral out-coupling makes the design more challenging given that nanophotonic effects typically rely on coherent resonant phenomena that are restricted to narrow spectral bandwidths and preferred orientations [17-19]. Embodiments disclosed herein further demonstrate that limited disorder in the array which is often encountered in fabrication can improve the out-coupling efficiency.

Figure 3A:
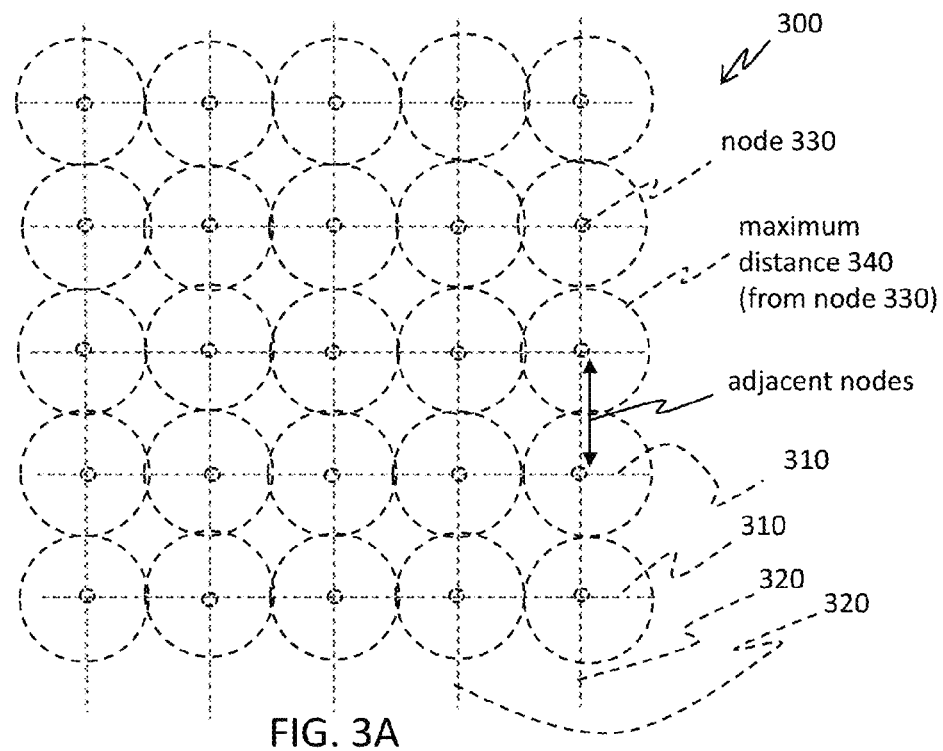
FIG. 3A shows a theoretical lattice structure and FIG. 3B shows an electrode surface of an OLED, such as a cathode surface, according to one exemplary embodiment.
Figure 3B:
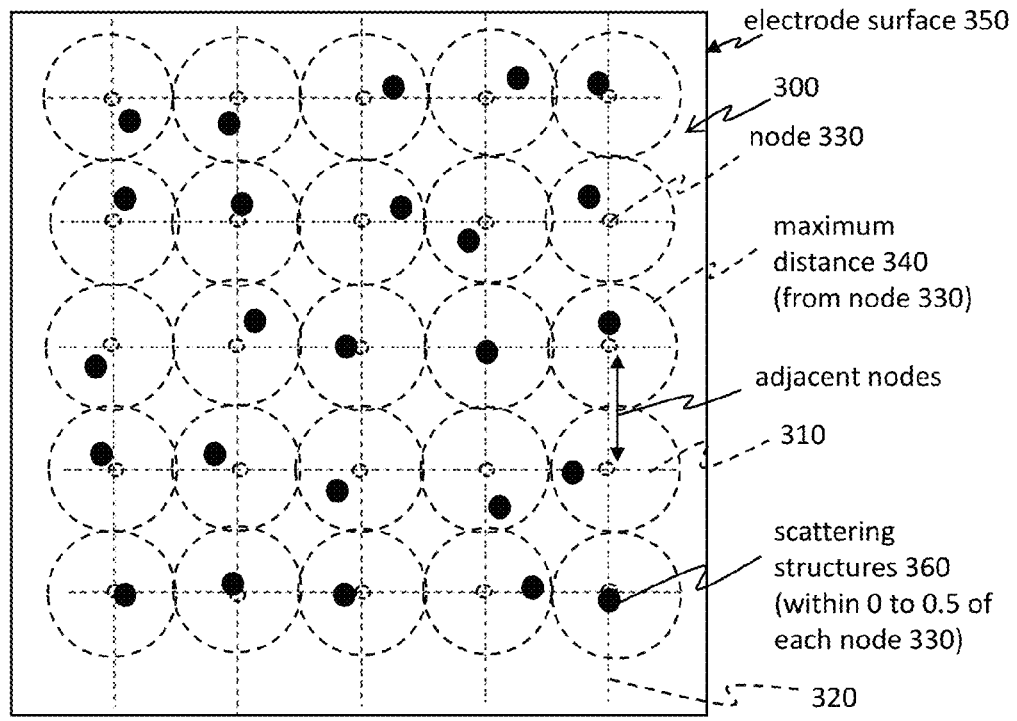

In one embodiment, an organic light emitting device includes an OLED including an anode, a cathode, and at least one organic layer between the anode and cathode, as described previously. With reference now to FIGS. 3A and 3B, a theoretical lattice pattern in isolation (FIG. 3A) and the theoretical lattice pattern overlaying an electrode surface (FIG. 3B) of any of the devices contemplated herein, are shown. In one embodiment, the electrode is functionally designated as the cathode. However, it should be appreciated that the present invention is not limited to the texturing of any particular electrode in the device, and therefore the textured electrode may be the cathode, the anode, or both.

As shown in FIG. 3A, the theoretical lattice 300 generally includes a cross-hatching of substantially parallel lines 310 and 320, with the nodes 330 of the lattice representing the intersection of all perpendicular lines 310 and 320. In certain embodiments, the distance between any adjacent parallel lines in the lattice may be between 0.1 to 2 µm. Also, shown in FIG. 3A is a region 340 defined, by non-limiting example, by a radius equaling about 0.5 the distance between adjacent nodes along each line of the lattice. In other embodiments, the radius distance may be about 0.4, 0.3, 0.2, 0.1, 0.05, without limitation. It should be appreciated that the lattice pattern and designation of distance from each node to form the region 340 may vary, without limitation. For example, the lattice pattern can form regions 340 of any geometry. The lattice pattern can include cross-hatching of straight lines or curved lines, or lines resembling periodic functions. The lattice pattern can include periodic segments of both straight line segments and curved line segments. The lattice pattern can be, for example, a number of periodic circles, ovals, triangles, quadrilaterals, rectangles, squares, polygons, pentagons, hexagons, and other similar types of multi-sided geometries. The lattice pattern can also include a weave of periodic functions, such as sine waves. The periodic functions can also be intersected by lines or other types of shapes as described above to form any geometric shape of the region 340. Accordingly, it should be appreciated that the theoretical lattice pattern 300 can be of any desired size and shape, such that regions 340 of an electrode surface may be defined when the theoretical lattice is overlaid on the electrode surface.

Referring now to FIG. 3B, the exemplary theoretical lattice pattern 300 of FIG. 3A is overlaid on an electrode surface 350. The electrode 350 may be formed from any electrode material understood in the art for use in OLEDs, including all known transparent and non-transparent materials. Preferably, the scattering structures form part of the electrode material. However, in other embodiments, the structures may be of a separate material and positioned on or within the electrode surface using deposition techniques understood by those skilled in the art. As shown, the electrode surface 350 may include a plurality of scattering structures 360 positioned in a partially disordered pattern, as defined by one or more scattering structures being positioned randomly within the regions 340 of the lattice. In one embodiment, a single scattering structure 360 is present at a random point within each region 340 formed by the lattice pattern. In other embodiments, the number of scattering structures 360 positioned within each region 340 is between 0-1, 0-2 or 0-3. It should also be appreciated that the scattering structures may be positioned in an ordered pattern. For example, the scattering structures may be positioned exactly on the lattice nodes, or at a specific position that is a designated distance and direction along the electrode surface from each node. Likewise, in other embodiments the scattering structures may be positioned in a truly disordered or random placement on the electrode surface.

Accordingly, at least a portion of the electrode surface includes multiple scattering structures positioned in an ordered, disordered or partially disordered pattern. In certain embodiments, the scattering structures are positioned around the nodes of the two dimensional lattice with the average distance between the position of each scattering structure and a respective node of the lattice is from 0 to 0.5 of the distance between adjacent lattice nodes. In one embodiment, the scattering structures are on the electrode surface adjacent to, or facing, the organic layer. In another embodiment, the scattering structures are on the electrode surface opposite the organic layer. In other embodiments, both surfaces of the electrode include a plurality of scattering structures. In one embodiment, the distance between at least two of the scattering structures is from 150 nm to 650 nm. In one embodiment, at least one of the scattering structures is a protrusion from the electrode surface. In one embodiment, the at least one scattering structure protrudes into the at least one organic layer. In one embodiment, at least one of the scattering structures is a recess into the electrode surface. In certain embodiments the height of the protrusion, or depth of the recess, may be between 1 nm and 1 μm from the electrode surface. In certain embodiments the height of the protrusion, or depth of the recess, may be between 10 nm and 500 nm from the electrode surface. As contemplated herein, the scattering structures may be of any desired shape or geometry. For example, the scattering structures may be shaped as hemispheres, rectangles, pyramids, cylinders and the like.

In one embodiment, the device is a bottom-emitting OLED device. In another embodiment, the device is a top-emitting OLED device. A method of manufacturing an organic light emitting device having at least one textured electrode surface is also described. In one embodiment, an OLED is disposed on a substrate, the OLED including an anode, a cathode and at least one organic layer between the anode and cathode. At least a portion of at least one of the electrode surface is textured with a plurality of scattering structures positioned in a partially disordered pattern resembling nodes of a two dimensional lattice. The scattering structures are positioned around the nodes of the two dimensional lattice with the average distance between the position of each scattering structure and a respective node of the lattice is from 0 to 0.5 of the distance between adjacent lattice nodes. In one embodiment, the scattering structures are textured via soft stamp embossing. In one embodiment, the scattering structures are textured via hard stamp embossing. In one embodiment, the scattering structures are textured via soft contact removal.

A method of enhancing the light-extraction efficiency of an organic light emitting device is also described. In one embodiment, at least a portion of an electrode surface of an OLED is textured with a plurality of scattering structures positioned in a partially disordered pattern resembling nodes of a two dimensional lattice. The scattering structures are positioned around the nodes of the two dimensional lattice with the average distance between the position of each scattering structure and a respective node of the lattice is from 0 to 0.5 of the distance between adjacent lattice nodes. In one embodiment, the scattering structures are textured via soft stamp embossing. In one embodiment, the scattering structures are textured via hard stamp embossing. In one embodiment, the scattering structures are textured via soft contact removal. In one embodiment, at least one of the scattering structures is a protrusion. In one embodiment, the scattering structures are hemispheres. In one embodiment, the partially disordered pattern resembles nodes of a two dimensional square lattice. In one embodiment, the partially disordered pattern resembles nodes of a two dimensional periodic lattice.

EXPERIMENTAL EXAMPLES

The optical properties of the WOLEDs were computed using full 3D electrodynamic simulations via MEEP—an open-source finite-difference time-domain (FDTD) software tool [8]. Using this approach, the Poynting vector over a wide spectral bandwidth using a short temporal pulse can be computed, simulating a large supercell with its distributed-memory-parallelism and subpixel-smoothing features and model the dynamics of radiative exciton decay with nanometer-scale resolution using its customizable-source and pervasive-interpolation capabilities. First, according to one embodiment, a planar, bottom-emitting WOLED is comprised of four separate stacked layers: an Al cathode (thickness 100 nm), an organic film comprised of hole-transporting (40 nm) and emissive (20 nm) and electron-transporting (40 nm) layers, an indium-tin oxide (ITO) transparent conductive film (100 nm), on top of a semi-infinite glass substrate with a square profile of length L, as shown in FIG. 4a. The refractive indices of the glass, organic and ITO layers are $n_{glass}$=1.45, $n_{ORG}$=1.8 and $n_{ITO}$=1.8 where losses in the ITO have been ignored since this layer is optically thin, and our primary focus is on plasmonic losses. The Al cathode is a lossy metal modeled using a Drude-Lorentzian fit that spans the WOLED emission spectrum [20]. The wavelength-dependent total power emitted by ten different incoherent (i.e., random phase) electric point-dipole sources evenly distributed along a vertical line centered within the emissive layer (EML) was computed, in addition to the power in the glass, organic and ITO layers (i.e., waveguide modes), the cathode/organic interface (i.e., surface-plasmon polaritons) and the absorption at the cathode. The ratio of the power in each of these components to the total dipole emission therefore gives the fraction of the total power that is distributed among the different device regions. Ten separate simulations are made for both planar and textured cathodes and the results averaged due to the random nature of the sources and in some cases the texture itself.

The total power emitted by a dipole source at a point in the EML is proportional to the local density of states (LDOS) at that point [21] which, in turn, is proportional to the rate of spontaneous emission obtained via Fermi's Golden Rule [22-24]. FDTD is used to compute the spontaneous-emission-rate enhancement factor defined as the ratio of the average power radiated per dipole in the textured compared to the unpatterned device using identical coherent point sources in a single simulation. For calculations involving structures with textured surfaces, 16000 electric-dipole emitters were used that are evenly distributed within a rectangular volume of length a centered within the EML so as to sample the LDOS over the entire EML. In all cases, a resolution of 10 nm/pixel was used which, in combination with its subpixel-smoothing function, allows MEEP to model features whose scale is only a few nanometers.

FIGS. 5a and b show the simulated results for two orthogonal dipole orientations: parallel and perpendicular to the layers of an untextured WOLED with L=5 μm. Here the total emitted power is separated into its components of glass, combined cathode/organic interface and organic/ITO waveguide (Al+ORG+ITO), and Al absorption. The average of each quantity over the entire wavelength interval is given, along with its standard deviation. We refer to the one pertaining to the glass as the light-extraction efficiency. As expected, the power reaching the glass is significantly less for perpendicular than for parallel dipoles (3% versus 60%), which is attributed to the large absorption losses of the Al cathode arising from surface-plasmon polaritons (SPPs) [25] at the cathode/organic interface. Absorption losses from SPPs are still present for parallel dipoles but are much less significant (~25% of the total emission) than perpendicular ones (~84%). This is due to reduced coupling to SPPs as a result of mismatched electric-field boundary conditions for parallel dipoles, which suggests that large enhancements in the spontaneous-emission rate are possible for a non-planar, textured interface [26, 27].

The proportion of the total emission reaching the air assuming that the escaping light rays are isotropically incident on the planar glass-air interface is approximately $1/n^2_{glass} \times (\frac{1}{3}P\perp + \frac{2}{3}P\|) \approx 20\%$ where $P\perp$ and $P\|$ are the emitted powers into the glass for perpendicular and parallel dipoles, respectively [2, 3]. The average power is plotted in each region as a function of propagation length under the cathode in FIGS. 5c and d. The fraction of light absorbed by the Al cathode monotonically increases whereas the waveguide component decreases with propagation length, indicating that most of the power outside the glass resides within the SPPs. For perpendicular dipoles, the Al absorption reaches approximately 95% of the total emission at L=10 μm, indicating that SPP losses are dominant for waveguide-mode propagation. FIGS. 5c and d also indicate that the SPP length is very short, and hence nanoscale texturing of the cathode surface can be effective in scattering the non-radiating SPPs.

An effective nanoscale texture scatters all SPP modes into a direction normal to the interface while also increasing the spontaneous-emission rate. This requires the identification of such modes from their dispersion relation for the device, and then the determination of the wavevector range across the emission spectrum of the WOLED. In certain embodiments, some disorder is be necessary to ensure that the intrinsically-narrowband resonant effects of ordered textures spans the entire spectrum [17-19]. The dispersion relation can be computed for the WOLED configuration in FIG. 4a by solving [28]$(\in_1\in_3 S_2^2 + \in_2^2 S_1 S_3)\tan(S_2 d) + \in_2 S_2 (\in_3 S_1 + \in_1 S_3) = 0$ where $S_1^2 = k_{SPP}^2 - \in_i \omega^2/c^2$ and $\in_i$ is the dielectric constant of the ith layer (i.e., i=1 is for the glass, i=2 is for the combined organic/ITO films, and i=3 is for the Al cathode), $k_{SPP}$ is the wavevector of the SPP mode, ω its angular frequency, c is the speed of light and d is the thickness of the high-index organic/ITO layer (200 nm).

Figure 4B:
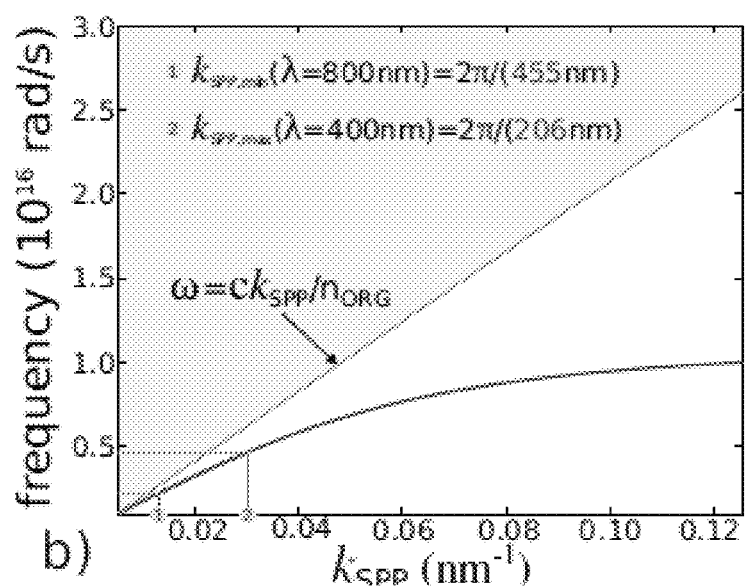
FIG. 4B shows dispersion relation of the surface-plasmon polaritons (SPP) at the cathode/organic interface of the OLED according to on embodiment. The highlighted portion of the band corresponds to the operating range of white-emitting OLEDs: dashed lines extending from the frequency axis are modes with vacuum wavelengths of 400 nm to 800 nm with associated wavevectors ($2\pi/\lambda_p$ where $\lambda_p$ is the wavelength of the plasma oscillation) noted on the horizontal axis. The shaded region is the light cone of the organic/ITO film.

The SPP dispersion relation is shown in FIG. 4b. The light line of the organic/ITO film is also shown. The SPPs that lie below the line cannot couple to radiative modes within the light cone and thus are ultimately completely absorbed by the metal. The subset of modes within the WOLED are shown as the red portion of the blue-colored band where their corresponding group velocities, $\nabla_k \omega$, are relatively large compared to modes at larger wavevectors. This, in turn, results in a reduced density of states (DOS) and hence a proportionately weaker effect on boosting the spontaneous-emission rate [21]. The dashed lines indicate modes with wavelengths of 400 nm and 800 nm that bound the usable emission spectrum of the WOLED. When these modes are expressed in terms of wavelengths of the plasma oscillation ($\lambda_p$), they are 206 nm and 455 nm, respectively. The SPP modes are therefore unaffected by intrinsic surface roughness having characteristic length scales of a few tens of nanometers [29], which indicates that for effective scattering to occur, the surface must be carefully engineered. For the SPPs to scatter into radiation modes, momentum transfer is necessary via interaction with the cathode. If the in-plane-wavevector component of the radiative mode (horizontal axis, FIG. 4b) into which the SPP scatters is zero (i.e., $k_\| = k_{SPP} - k_{texture} = 0$), its out-of-plane wavevector component is then $k\perp = \omega n_{ORG}/c$ and hence the mode scatters out normal to the layers. This suggests that to act as an effective grating out-coupler, the Fourier transform of the textured interface should span the full range of wavevectors for all SPPs in the plane.

This finding, therefore, provides a general criterion for texturing that can be met, for example, by a 2D square lattice of Al hemispherical scatterers protruding into the ETL with periodicity a and radius r (see FIG. 4a). Disorder is also controllably incorporated into the lattice via a perturbation Δp to each scattering site chosen randomly from a uniform distribution of values between 0 and $\overline{\Delta p}$ for both orthogonal in-plane directions. The lattice of hemispheres explored in this work can be extended to irregular geometries including arbitrarily-shaped folds [30] or nanoparticles [27] as will be later demonstrated. The case has also been investigated where dielectric scatterers protrude into the cathode, and find that the out-coupling efficiency is significantly reduced in comparison, which is likely due to the smaller penetration of the SPP field into the metal than the dielectric.

FIG. 6a shows results for perpendicularly-oriented dipoles for a WOLED with a surface texture array of total length L=10 μm with a=550 nm, r=40 nm $\overline{\Delta p}$=0 and (i.e., no disorder). To ensure consistency among designs with different textures, the distance between the EML and the patterned Al cathode is fixed at 40 nm independent of the hemisphere radius. In this case, the fraction of total emission reaching the glass is more than 15% (averaged over all wavelengths), which is nearly a factor of five greater than for the unpatterned case of FIG. 5b. Note, however, that there is a large variation of the extraction efficiency over the wavelength spectrum: small wavelengths have values above 30% while large wavelengths, where plasmon losses still dominate, less than 10%.

To understand why this hemispherical surface texture gives rise to an enhancement in the extraction efficiency, the Fourier transform of the height function, $|\tilde{h}(k_x, k_y)|$, is shown in FIG. 6c, where $k_x$ and $k_y$ are wavevectors. The spectral peaks of the array are evident, particularly in the region where the SPPs lie as denoted by the annular zone containing 20 peaks, 12 of which are distributed evenly in all radial directions and centered near the middle of the ring. This arrangement facilitates scattering of SPPs within a range of wavevectors of different magnitudes and directions into radiative states. This also explains why the extraction efficiency in FIG. 6a is more pronounced at smaller than at larger wavelengths since the majority of the spectral peaks within the ring of FIG. 6c lie closer to its outer boundary.

The effect of changing a while keeping r and $\overline{\Delta p}$ fixed and thus shifting the positions of the peaks within the annular zone, has a significant effect on the scattering efficiency. When the spectral peaks are distributed either sparsely or unevenly within the annular zone, fewer SPPs are radiatively scattered leading to a reduction in the extraction efficiency. As an example, for a=150 nm, 250 nm, 350 nm, 450 nm and 650 nm, the efficiency enhancements are reduced in absolute terms by 4.4%, 4.0%, 6.1%, 6.6% and 7.2%, respectively, relative to the optimal texture with a=550 nm. The choice of a square lattice is arbitrary; any periodic arrangement of scatterers would have the same effect.

The spontaneous emission rate enhancement factor of both dipole orientations in FIG. 6b shows noticeable gains. The enhancement is especially significant for parallel dipoles since the texture relaxes the electric-field boundary conditions that prevent coupling to the SPPs. This enhancement in spontaneous emission for parallel dipoles comes at the expense of a slightly reduced extraction efficiency (61.2%±1.6% for the unpatterned case versus 58.0%±8.2% for the lattice) which is more than offset by the gains for perpendicular dipoles (3.4%±1.4% versus 15.3%±11.4%). The presence of spectral features is evident for the perpendicular dipoles in FIG. 6b, particularly near 550 nm matching that of the lattice periodicity, which readily couple to SPP modes. The choice of a has a major impact on the spontaneous-emission rate for both dipole orientations as smaller lattice constants have larger enhancements than bigger ones due to an increased modulation of the surface.

Increasing the size of the scatterers, and thus the amplitude of the spectral peaks also affects the light extraction efficiency, as shown in FIG. 6d. For a=550 nm and no disorder, the extraction efficiency of perpendicular dipoles increases from 4.7%±3.5% to 42.5%±6.5% via a reduction in the Al absorption as the radius is increased from 20 nm to 100 nm, or almost 13 times higher than for the unpatterned case. Even greater enhancements are possible using larger feature sizes. However, the plasmonic losses for parallel dipoles increase in the same interval (from 19.9%±2.7% to 35.0%±10.7%), indicating that there is an optimal value for r, of ~40 nm, that balances the gain for perpendicular with the loss for parallel dipoles. There is no such pronounced change in the spontaneous emission of perpendicular dipoles with increasing size of the hemispheres although the parallel dipoles show a decrease, again indicating that smaller scatterers are preferable.

Figure 7A:
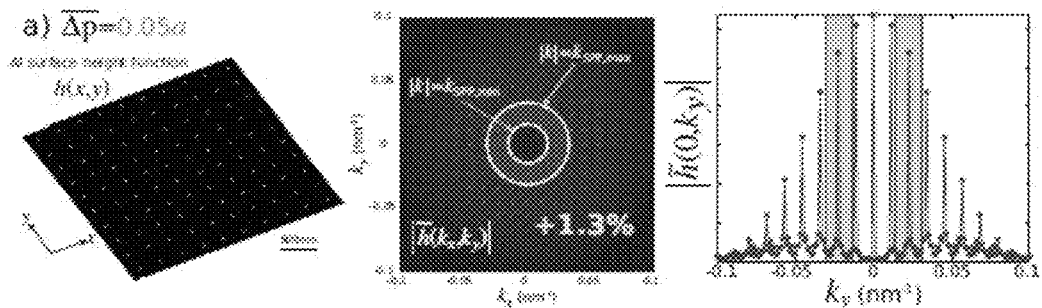
FIGS. 7A-7C show a schematic of the surface height function of the cathode, its corresponding Fourier transform and a 1D cross section (with the wavevectors of the SPP modes shown in the gray region) for three different cathode lattice arrays with a=550 nm and r=40 nm, where the disorder $\overline{\Delta p}$ is: (a) 0.05a, (b) 0.2a and (c) 0.4a. For $\overline{\Delta p}$=0.05a, the average extraction efficiency for perpendicular dipoles is increased by 1.3% absolute and 8.5% relative beyond the unperturbed lattice due to the slight broadening of the peaks. Further increases in the disorder results in the elimination of the peaks and hence a reduction in the extraction efficiency. In the limit of large disorder where no traces of the peaks remain, the extraction efficiency is still enhanced beyond that of an unpatterned interface. Results for parallel dipoles show similar trends.
Figure 7B:
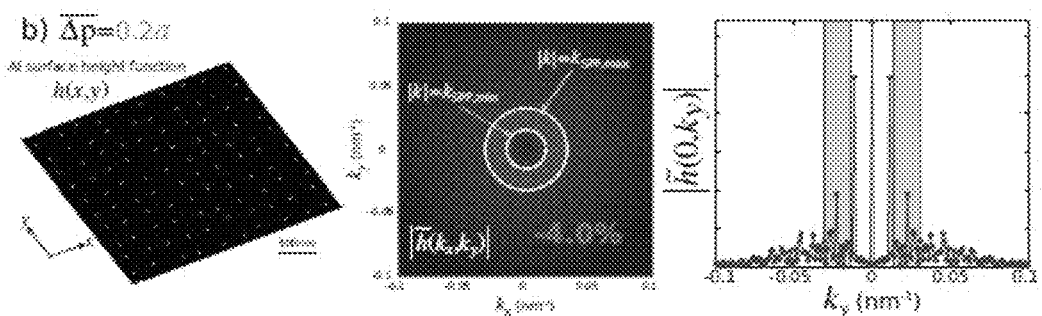
Figure 7C:
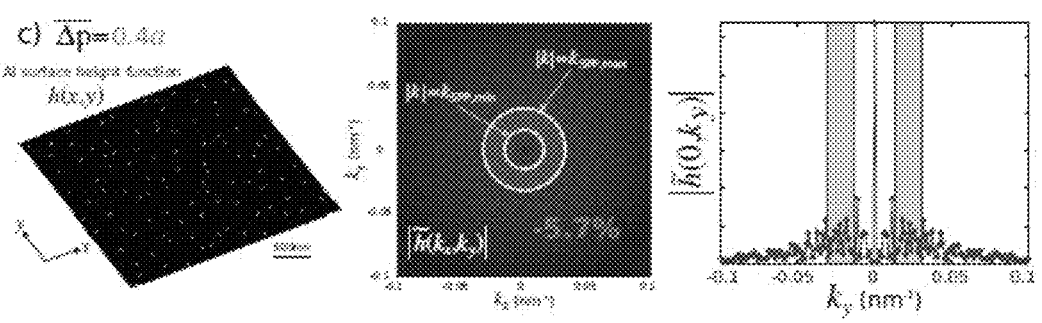

FIGS. 7A-7C show h(x, y) of the Al cathode, $|\tilde{h}(k_x, k_y)|$ and a 1D cross-section $|\tilde{h}(0,k_g)|$ for a=550 nm and r=40 nm having three different disorder parameters $\overline{\Delta p}$. For a lattice with a limited disorder of $\overline{\Delta p}$=0.05a, the average extraction efficiency of perpendicular dipoles is increased by 1.3% absolute and 8.5% relative beyond that of the unperturbed lattice due to the slight broadening of the spectral peaks which increases the number of scattered SPPs. However, for $\overline{\Delta p}$>0.05a, the effect of the broadening is outweighed by the reduction in peak amplitude which results in a decrease of the extraction efficiency. A highly disordered lattice texture lacking spectral features still outperforms a smooth interface given that some degree of scattering remains. Similar results were found for parallel dipoles. The enhancements beyond the unperturbed lattice obtained with limited disorder are even greater with larger scatterers. The tradeoff in the peak amplitude vs. width via partial disorder can therefore be used to increase the light-extraction efficiency beyond that of any perfectly periodic surface texture. Partial disorder, however, has little effect on the spontaneous-emission rate since the DOS is unaffected. Disorder also, as expected, reduces the variation in the extraction efficiency over the wideband spectrum: for perpendicular dipoles, the standard deviation of the averaged extraction efficiency is reduced monotonically by 5.2% absolute for $\overline{\Delta p}$=0.4a compared to the unperturbed case. Peak broadening arising from lattice disorder can also be realized by introducing small non-uniformities into the size and morphology of the scattering objects, replacing the hemispheres used here with arbitrarily shaped folds [30] or nanoparticles [27].

Thus, it has been demonstrated shown how a 2D lattice of metallic hemispheres at the cathode/organic interface can be tailored to reduce losses from SPPs, and enhance both the light-extraction efficiency and the spontaneous-emission rate of excitons in WOLEDs compared with an unpatterned device. The effects of different lattice features have been explored on both the scattering efficiency of SPPs and the exciton decay rate for isotropic emission spanning a broad bandwidth. This approach is similarly applicable to an arbitrary texture, and hence can be used to explore optimal designs for different OLED layering schemes and emission spectra. Surface textures at the cathode/organic interface based on the general design strategies presented in this work may potentially lead to marked improvements in the overall efficiency of OLEDs, although the fabrication of such small features required for efficient SPP outcoupling remains a challenge.

FIGS. 8A and 8B show optical properties of a planar and textured OLED respectively. The planar OLED in the parallel dipole orientation saw a fraction of total power average of 44.4% for glass, 40.4% for Al absorption, and 15.2% for Al+ORG+ITO. The planar OLED in the perpendicular dipole orientation saw a fraction of total power average of 5.1% for glass, 93.0% for Al absorption, and 1.9% for Al+ORG+ITO. The textured OLED in the parallel dipole orientation saw a fraction of total power average of 59.8% for glass, 19.0% for Al absorption, and 21.2% for Al+ORG+ITO. The textured OLED in the perpendicular dipole orientation saw a fraction of total power average of 31.4% for glass, 65.6% for Al absorption, and 3.0% for Al+ORG+ITO. This represents a 6× increase in the fraction of total power average for glass over the planar OLED in the perpendicular dipole orientation.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic light emitting device, comprising:
    an OLED including an anode, a cathode, and at least one organic layer between the anode and cathode;
    wherein at least a portion of the cathode surface includes a plurality of scattering structures positioned in a partially disordered pattern resembling nodes of a two dimensional lattice, wherein the scattering structures are positioned around the nodes of the two dimensional lattice with the average distance between the position of each scattering structure and a respective node of the lattice is from 0 to 0.5 of the distance between adjacent lattice nodes, and wherein at least two scattering structures have a different distance between their position and their respective nodes.

2. The device of claim 1, wherein the scattering structures are on the cathode surface adjacent the at least one organic layer.

3. The device of claim 1, wherein the distance between at least two of the scattering structures is from 150 nm to 650 nm.

4. The device of claim 1, wherein at least one of the scattering structures is a protrusion.

5. The device of claim 4, wherein the at least one scattering structure protrudes into the at least one organic layer.

6. The device of claim 1, wherein at least one of the scattering structures is a recess into the cathode surface.

7. The device of claim 1, wherein the scattering structures are hemispheres.

8. The device of claim 1, wherein the device is a bottom-emitting OLED device.

9. The device of claim 1, wherein the partially disordered pattern resembles nodes of a two dimensional square lattice.

10. The device of claim 1, wherein the partially disordered pattern resembles nodes of a two dimensional periodic lattice.

\* \* \* \* \*

UNITED STATES PATENT AND TRADEMARK OFFICE
CERTIFICATE OF CORRECTION

PATENT NO. : 9,761,842 B2
APPLICATION NO. : 14/976786
DATED : September 12, 2017
INVENTOR(S) : Ardavan Oskooi et al.

Page 1 of 1

It is certified that error appears in the above-identified patent and that said Letters Patent is hereby corrected as shown below:

Below the paragraph titled "Cross Reference to Related Applications" and above the paragraph titled "Parties to a Joint Research Agreement," please insert the following:

--STATEMENT REGARDING FEDERALLY SPONSORED RESEARCH OR DEVELOPMENT
This invention was made with U.S. Government support under Grant No. DMR-1311064 awarded by the National Science Foundation. The government has certain rights in this invention.--

Signed and Sealed this
Tenth Day of October, 2017

Joseph Matal
*Performing the Functions and Duties of the*
*Under Secretary of Commerce for Intellectual Property and*
*Director of the United States Patent and Trademark Office*